(12) United States Patent
Lin et al.

(10) Patent No.: US 11,535,938 B2
(45) Date of Patent: Dec. 27, 2022

(54) SHOWER HEAD ASSEMBLY AND ATOMIC LAYER DEPOSITION DEVICE

(71) Applicant: SKY TECH INC., Hsinchu County (TW)

(72) Inventors: Jing-Cheng Lin, Hsinchu County (TW); Ching-Liang Yi, Hsinchu County (TW); Yun-Chi Hsu, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 190 days.

(21) Appl. No.: 17/191,465

(22) Filed: Mar. 3, 2021

(65) Prior Publication Data

US 2022/0282376 A1    Sep. 8, 2022

(51) Int. Cl.
*C23C 16/40*  (2006.01)
*C23C 16/455*  (2006.01)

(52) U.S. Cl.
CPC .. *C23C 16/45565* (2013.01); *C23C 16/45544* (2013.01)

(58) Field of Classification Search
CPC ........ C23C 16/45561; C23C 16/45565; C23C 16/45544; H01J 37/3244; H01J 37/32449
USPC .......................... 118/715; 156/345.33, 345.34
See application file for complete search history.

(56) References Cited

U.S. PATENT DOCUMENTS

| | | | | |
|---|---|---|---|---|
| 5,532,190 A | * | 7/1996 | Goodyear | ........... C23C 16/5096 118/723 R |
| 6,132,512 A | * | 10/2000 | Horie | ................ C23C 16/45565 239/432 |
| 8,715,455 B2 | * | 5/2014 | Brcka | ............... H01J 37/32449 156/345.39 |

* cited by examiner

*Primary Examiner* — Rudy Zervigon
(74) *Attorney, Agent, or Firm* — Chun-Ming Shih; HDLS IPR Services

(57) ABSTRACT

A shower head assembly of an atomic layer deposition device has a first trapezoidal column component, a second trapezoidal column component and a column component, wherein a first bottom edge of the first trapezoidal column component is connected to a second top edge of the second trapezoidal column component, and a second bottom edge of the second trapezoidal column component is connected to a top edge of the column component. The first trapezoidal column component has a first bottom dimension distance, the second trapezoidal column component has a second vertical distance, and the column component has a column vertical distance, wherein a ratio of the column vertical distance to the second vertical distance is greater than or equal to 1.2, and a total distance of the second vertical distance and the column vertical distance is less than the first bottom dimension distance.

20 Claims, 9 Drawing Sheets

SHOWER HEAD ASSEMBLY AND ATOMIC LAYER DEPOSITION DEVICE

BACKGROUND

1. Technical Field

The present disclosure relates to a shower head assembly and an atomic layer deposition (ALD) device, in particular to a shower head assembly with a specific specification to optimize substrate uniformity in an ALD process, and to an atomic layer deposition device using the shower head assembly.

2. Description of Related Art

The development of integrated circuit technology has matured, and current electronic products are developing toward the trend of light, thin, short, high performance, high reliability and intelligence. The miniaturization technology of transistors in electronic products is very important. Small size transistors will have an important impact on the performance of electronic products. When the size of the transistor becomes smaller, the current transmission time and energy consumption can be reduced to achieve fast calculations and energy saving. In today's tiny transistors, some of the key thin film layer almost has a thickness formed by only few atoms, and one of the technologies to develop these microstructures is the atomic layer deposition (ALD) process.

The ALD process is a technology in which substances are deposited layer by layer on the surface of a substrate in the form of single atom. In the ALD process, reaction precursor is chemically adsorbed on a material surface of the substrate or the previous film to produce a thin film with uniform deposition. The uniform deposition of the thin film is an important basis for the reduction of transistors, and how to effectively control the uniformity of the thin film is an important issue for the development of current transistors.

At present, the uniformity control of the ALD process is still not completely perfect. One of the problems is that the shower head assembly in the ALD device mainly provides the reaction precursor to a chamber through a center of the shower head assembly. The design of the ALD device often results that the center of the substrate receives more reaction precursor, and the amount of reaction precursor contacting the periphery of the substrate is much less than the amount of reaction precursor contacting the center of the substrate. Thus, this causes a poor uniformity and makes it difficult for the substrate to fully and entirely react with the reaction precursor. In order to overcome the above problems, one of the methods is to lengthen the time that the reaction precursor stays in the chamber, so that the reaction precursor has enough time to fully react with the substrate, but this method will prolong the process time and lead to poor production efficiency. One other method is to increase the amount of reaction precursor, and thus the amount of reaction precursor contacting the substrate can be increased to compensate for the problem that there is less reaction precursor contacting the periphery of the substrate. However, this method will cause more cost expenditure. Therefore, how to improve the uniformity of the reaction precursor deposited on the substrate without affecting the efficiency and cost of the original process is an issue that needs to be overcome in the current ALD process.

SUMMARY

In order to overcome the deficiencies of the prior art, embodiments of the present invention provide a shower head assembly and an atomic layer deposition (ALD) device, wherein the shower head assembly is used for the ALD device. The structure of the shower head assembly has a specific specification, so that the reaction precursor is not sprayed directly from the center of the shower head assembly to the inside of the chamber, but the reaction precursor is diffused to the full range of the shower head assembly (that is, from the inside to the outside), and most or all of the reaction precursor then is sprayed into the chamber simultaneously to improve the deposition uniformity which the reaction precursor is deposited on the substrate. The shower head assembly has a first trapezoidal column component, a second trapezoidal column component and a column component, wherein a first bottom edge of the first trapezoidal column component is connected to a second top edge of the second trapezoidal column component, a second bottom edge of the second trapezoidal column component is connected to a top edge of the column component, and a first hollow part of the first trapezoidal column component, a second hollow part of the second trapezoidal column component and nozzles of the column component are communicated with each other. The column component has a column vertical distance, the second trapezoidal column component has a second vertical distance, and the first trapezoidal column component has a first bottom dimension distance (for example, a bottom diameter of the first "trapezoidal column", or a diagonal distance of the first "trapezoidal prism" The bottom diagonal distance), wherein a ratio of the column vertical distance to the second vertical distance is greater than or equal to 1.2, and a total distance of the column vertical distance and the second vertical distance is less than the first bottom dimension distance.

According to one objective of the present disclosure, an embodiment of the present disclosure provides a shower head assembly for an integrated circuit manufacturing process. The shower head assembly comprises a first trapezoidal column component, a second trapezoidal column component and a column component. The first trapezoidal column component has a first top edge, a first bottom edge and a first hollow part. The first bottom edge has a first bottom dimension distance, the first bottom dimension distance is a first bottom diameter distance when the first trapezoidal column component is a first trapezoidal cylindrical column component, and the first bottom dimension distance is a first bottom diagonal distance when the first trapezoidal column component is a first trapezoidal prism component. The second trapezoidal column component has a second top edge, a second bottom edge and a second hollow part. The second top edge and the second bottom edge have a second vertical distance therebetween, the second top edge is connected to the first bottom edge of the first trapezoidal column component, and the second hollow part is communicated with the first hollow part. The column component has a top edge, a column bottom part and multiple nozzles. A top edge and the column bottom part has a column vertical distance therebetween, the column vertical distance is 2-3 cm, the top edge is connected to the second bottom edge of the second trapezoidal column component, and the nozzles are communicated with the second hollow part. The nozzles are vertical runners in the column component, and openings of the nozzles are disposed on the column bottom part. A total distance of the second vertical distance and the column vertical distance is less than the first bottom dimension distance According to one objective of the present disclosure, an embodiment of the present disclosure provides a shower head assembly for an integrated circuit manufacturing process. The shower head assembly comprises a first trapezoidal column component, a second trapezoidal column component and a column component. The first trapezoidal column component has a first top edge, a first bottom edge and a first hollow part. The first hollow part penetrates the first top edge and the first bottom edge. The second trapezoidal column component has a second top edge, a second bottom edge and a second hollow part. The second hollow part penetrates the second top edge and the second bottom edge, the second top edge and the second bottom edge have a second vertical distance therebetween, the second top edge is connected to the first bottom edge of the first trapezoidal column component, and the second hollow part is communicated with the first hollow part. The column component has a top edge, a column bottom part and multiple nozzles. The nozzles penetrate the top edge and the column bottom part, the top edge and the column bottom part has a column vertical distance therebetween, and the column vertical distance is 2-3 cm. The top edge is connected to the second bottom edge of the second trapezoidal column component, the nozzles are communicated with the second hollow part, the nozzles are vertical runners in the column component, and openings of the nozzles are disposed on the column bottom part. A ratio of a length of the vertical runner to the second vertical distance is larger than or equal to 1.2.

Optionally, a ratio of the column vertical distance to the second vertical distance is larger than or equal to 1.2

Optionally, a thinnest part of the vertical runner of the column component has a width of 0.4-1.5 mm.

Optionally, the ratio of the column vertical distance to the second vertical distance is 2-4.

Optionally, the ratio of the length of the vertical runner to the second vertical distance is 2-4.

Optionally, the first trapezoidal column component, the second trapezoidal column component and the column component are integrally formed or combined with each other to form the shower head assembly.

According to one objective of the present disclosure, an embodiment of the present disclosure provides an ALD device. The ALD device comprises one above mentioned shower head assembly, a reaction chamber and a substrate carrier. The reaction chamber has a vent opening, and the shower head assembly is disposed on the reaction chamber. The substrate carrier is disposed in the reaction chamber. The shower head assembly sprays reaction precursor to a substrate carried on the substrate carrier, and the vent opening exhausts excess reaction precursor from the reaction chamber.

Optionally, the substrate carried on the substrate carrier is a silicon wafer.

In short, the shower head assembly provided by the embodiment of the present disclosure is used in an ALD device, wherein the structure of the shower head assembly has a specific specification, so that the reaction precursor can be diffused to every part of the shower head assembly in advance. Then, most or all the reaction precursor is simultaneously provided into the chamber to improve the deposition uniformity of the substrate. Therefore, the present disclosure has advantages over the process and the market (such as the integrated circuit process) that require shower head assembly. In order to make the above and other objectives, features and advantages of the present disclosure more comprehensible, with the accompanying drawings, a detailed description is given as follows.

DESCRIPTION OF THE EXEMPLARY EMBODIMENTS

To understand the technical features, content and advantages of the present disclosure and its efficacy, the present disclosure will be described in detail with reference to the accompanying drawings. The drawings are for illustrative and auxiliary purposes only and may not necessarily be the true scale and precise configuration of the present disclosure. Therefore, the scope of the present disclosure should not be limited to the scale and configuration of the attached drawings.

The present disclosure provides a shower head assembly and an atomic layer deposition (ALD) device using the shower head assembly. The structure of the shower head assembly has a specific specification and a specific structural ratio, so that the reaction precursor can be diffused every part inside the shower head assembly in advance, and then the reaction precursor can be provided to the inside of the chamber for achieving uniform deposition. The shower head assembly has a first trapezoidal column component, a second trapezoidal column component and a column component. The first trapezoidal column component has a first top edge, a first bottom edge, and a first hollow part, and further has a first bottom dimension distance. A second trapezoidal column component has a second top edge, a second bottom edge and a second hollow part, and further has a second vertical distance. The column component has a top edge, a column bottom part, multiple nozzles and a column vertical distance. The first bottom edge of the first trapezoidal column component is connected to the second top edge of the second trapezoidal column component, and the second bottom edge of the second trapezoidal column component is connected to the top edge of the column component, so that the first hollow part of the first trapezoidal column component, the second hollow part of the second trapezoidal column component and the nozzles of the column component are communicated with each other. The specific specification of the shower head assembly structure is that a ratio of the column vertical distance to the second vertical distance is greater than or equal to 1.2, and/or a total distance of the second vertical distance and the column vertical distance is less than the first bottom dimension distance. The specific specification of the shower head assembly structure enables it to uniformly diffuse the reaction precursor to every part of the shower head assembly after receiving the reaction precursor, and enables the reaction precursor to be uniformly sprayed into the chamber of the ALD device. Thus, the reaction precursor is uniformly diffused to the surface of the substrate to improve the uniformity of the material deposition on the surface of the substrate.

Figure 1A:
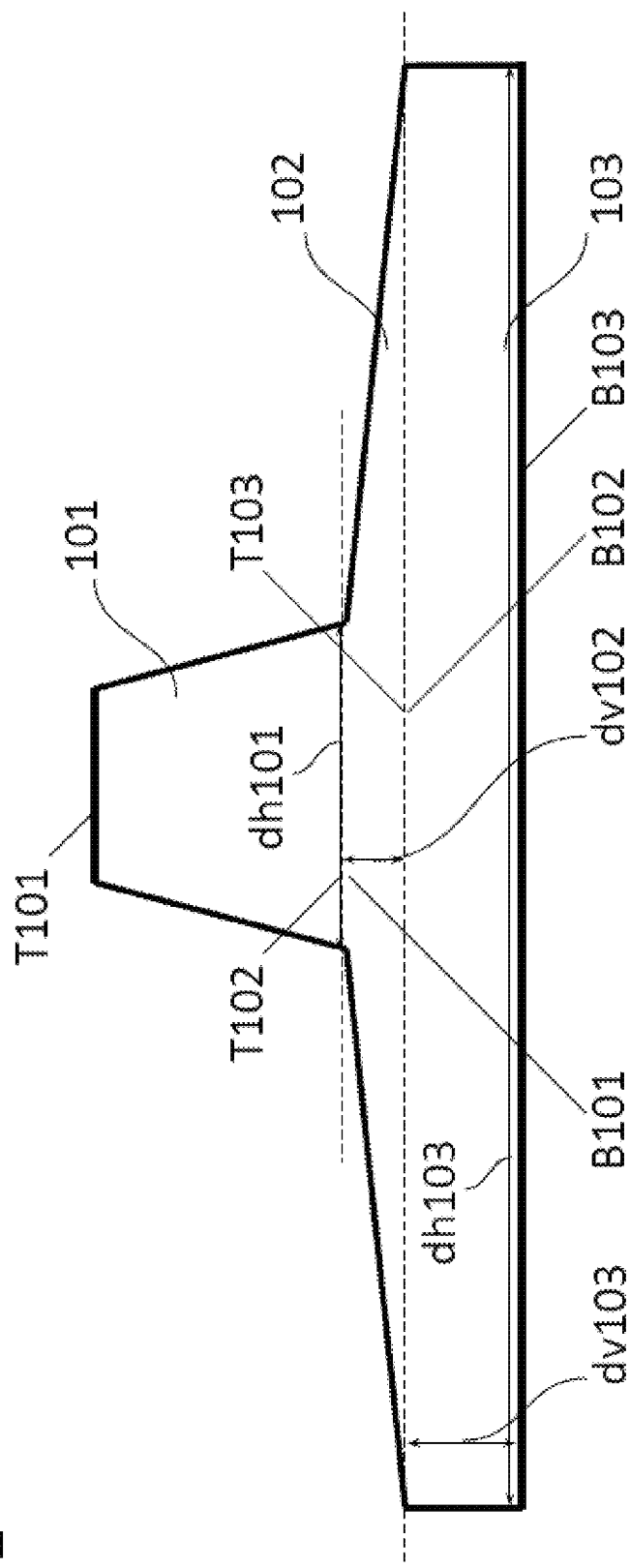
FIG. 1A is a front view of a shower head assembly according to one embodiment of the present disclosure.

Firstly, refer to FIG. 1A, and FIG. 1A is front view of a shower head assembly according to one embodiment of the present disclosure. As shown in FIG. 1A, the shower head assembly 1 comprises a first trapezoidal column component 101, a second trapezoidal column component 102 and a column component 103. The first trapezoidal column component 101 has a first top edge T101, a first bottom edge B101 and a first hollow part penetrating from the first top edge T101 to the first bottom edge B101; the second trapezoidal column component 102 has second a top edge T102, a second bottom edge B102 and a second hollow part penetrating from the second top edge T102 to the second bottom edge B102; and, the column component 103 has a top edge T103, a column bottom part B103 and a plurality of nozzles penetrating from the top edge T103 to the column bottom part B103.

The first and second trapezoidal column components are tapered columns. Specifically, the "trapezoidal column component" is a longitudinal section of the tapered column. The tapered cylinder has a top and a bottom, wherein the top and the bottom are both circular. The circumference of the top of the tapered cylinder is smaller than the circumference of the bottom of the tapered cylinder, and the area of the top of the tapered cylinder is smaller than the area of the bottom of the tapered cylinder.

Figure 1B:
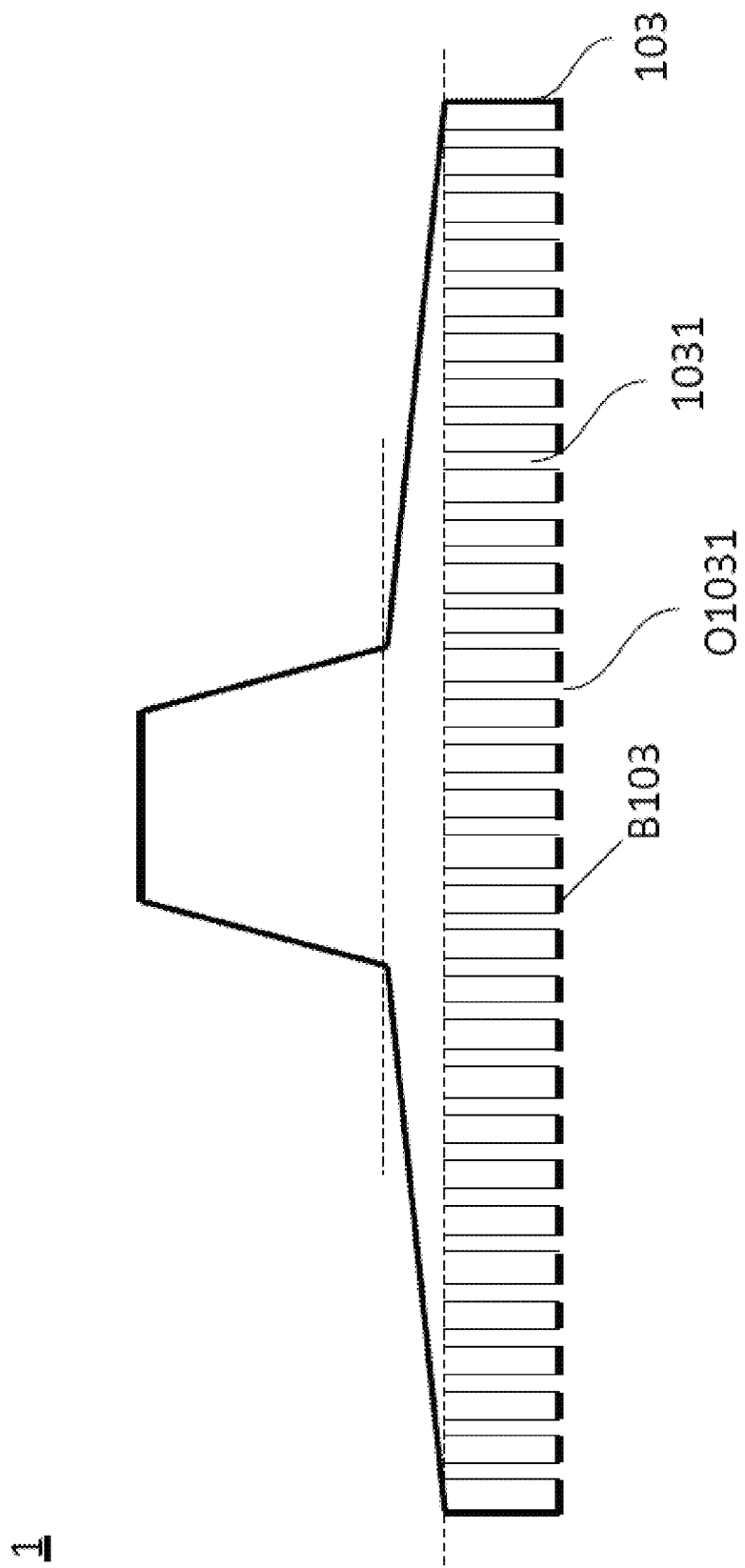
FIG. 1B is a sectional view of a shower head assembly according to one embodiment of the present disclosure.

Please refer to FIG. 1B for the type of the nozzles, and FIG. 1B is sectional view of a shower head assembly according to an embodiment of the present disclosure. As shown in FIG. 1B, the nozzles 1031 are a plurality of vertical runners in the column component 103, and a plurality of opening O1031 of the nozzles are set on the column bottom part B103. In one embodiment, the vertical section of the vertical runners is rectangular, but the present disclosure is not limited thereto. In one other embodiment, the longitudinal section of the vertical runners is also trapezoidal or irregular, for example. In one embodiment, the nozzles penetrating through the column component 103 may be connected to each other near the top edge T103.

Next, please continue to refer to FIG. 1A, the first bottom edge B101 of the first trapezoidal column component 101 is connected to the second top edge T102 of the second trapezoidal column component 102, so that the first hollow part and the second hollow part are communicated with each other. The second bottom edge B102 of the second trapezoidal column component 102 is connected to the top edge T103 of the column component 103, so that the first hollow part, the second hollow part and the nozzles are communicated with each other. The shower head assembly 1 can receive the target through the first top edge T101 (for example, but It is not limited to the substances or reaction precursors to be deposited in the integrated circuit process), and the target is sprayed from the nozzles. Further, the first trapezoidal column component 101, the second trapezoidal column component 102 and the column component 103 can be integrally formed or combined with each other.

Figure 2A:
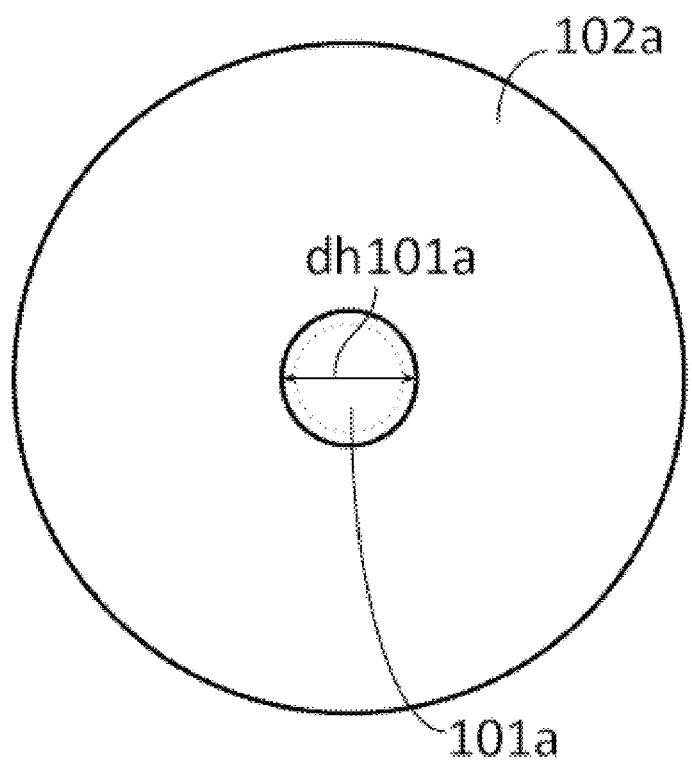
FIG. 2A is a top view of a shower head assembly according to one embodiment of the present disclosure.
Figure 2B:
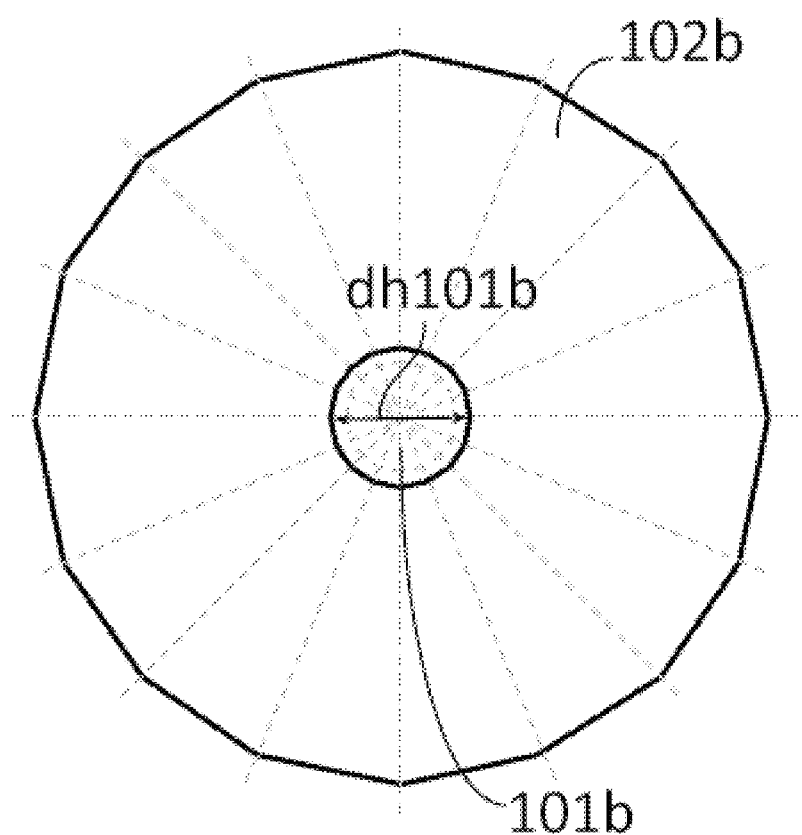
FIG. 2B is a top view of a shower head assembly according to one other embodiment of the present disclosure.
Figure 2C:
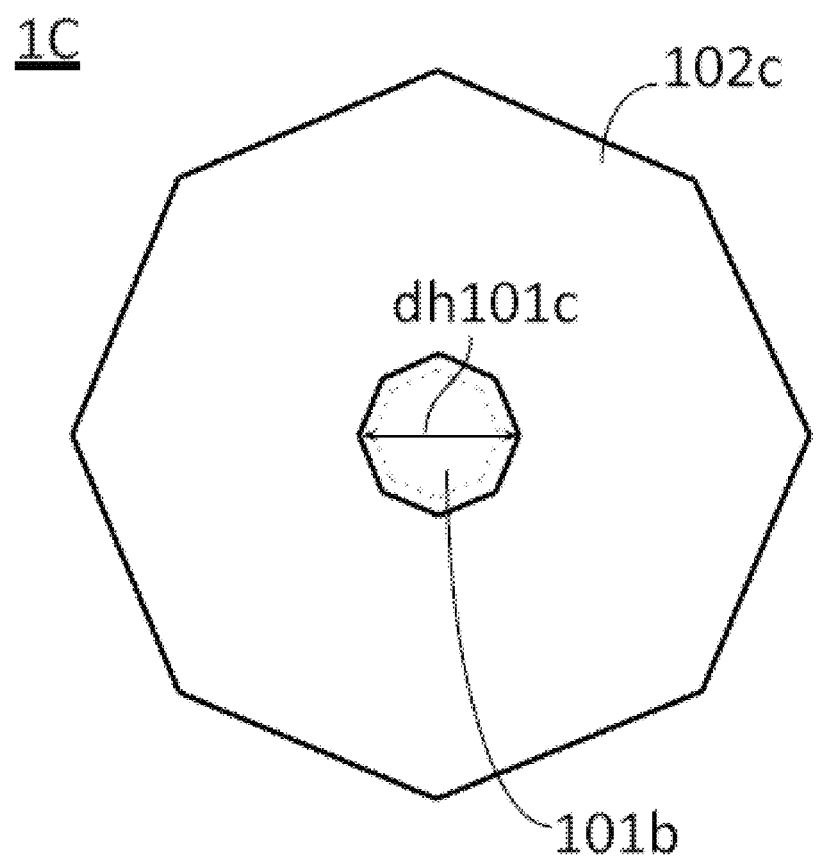
FIG. 2C is a top view of a shower head assembly according to one other embodiment of the present disclosure.

Refer to FIG. 1A and FIG. 2A-FIG. 2C, FIG. 2A is a top view of a shower head assembly according to one embodiment of the present disclosure, and each of FIG. 2B and FIG. 2C is a top view of a shower head assembly according to one other embodiment of the present disclosure. The first trapezoidal column component of the shower head assembly 1, 1A, 1B, and 1C may be the first trapezoidal cylindrical column component 101a as shown in FIG. 2A, or may also be the first trapezoidal prism component (for example, the first trapezoidal hexagonal column component 101b shown in FIG. 2B, or the first trapezoidal octagonal column component 101c as shown in FIG. 2C, but the present disclosure does not limit the number of sides of the trapezoidal prism component), wherein when the first trapezoidal column component is a trapezoidal prism component and has more polygons, the flow field of the material which passes the shower head assembly is more similar to the phenomenon when the first trapezoidal column component is a trapezoidal cylindrical column component.

The second trapezoidal column component may be the second trapezoidal cylindrical column component 102a as shown in FIG. 2A, or it may be the second trapezoidal prism column component (for example, the second trapezoidal hexagonal column component 102b as shown in FIG. 2B, or the second trapezoidal octagonal column component 102c as shown FIG. 2C, but the present disclosure does not limit the number of sides of the trapezoidal prism component). When the second trapezoidal column component is a trapezoidal prism component and has more polygonal sides, the flow field of the material which passes the shower head assembly is more similar to the phenomenon when the second trapezoidal column component is a trapezoidal cylindrical column component.

Figure 3A:
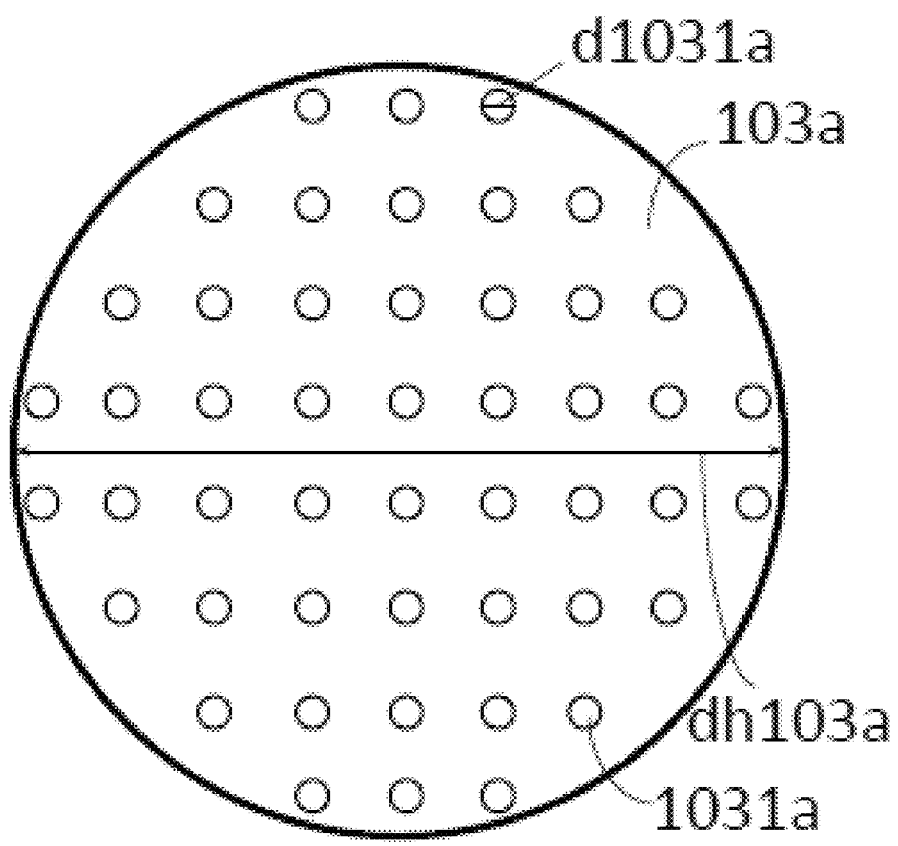
FIG. 3A is a bottom view of a shower head assembly according to one embodiment of the present disclosure.
Figure 3B:
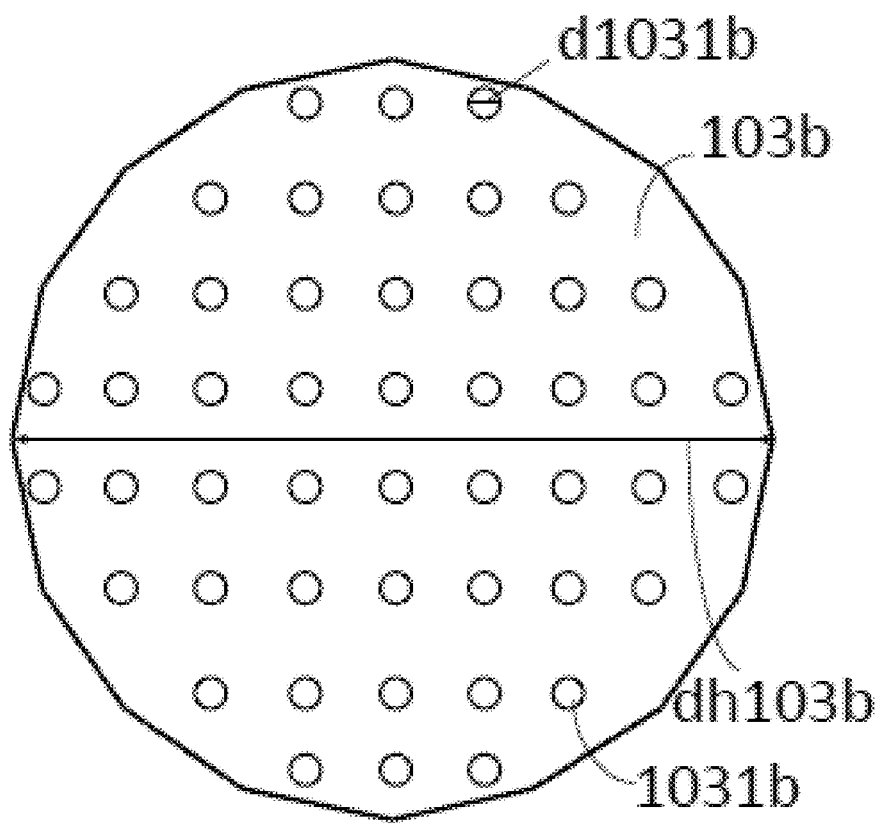
FIG. 3B is a bottom view of a shower head assembly according to one other embodiment of the present disclosure.
Figure 3C:
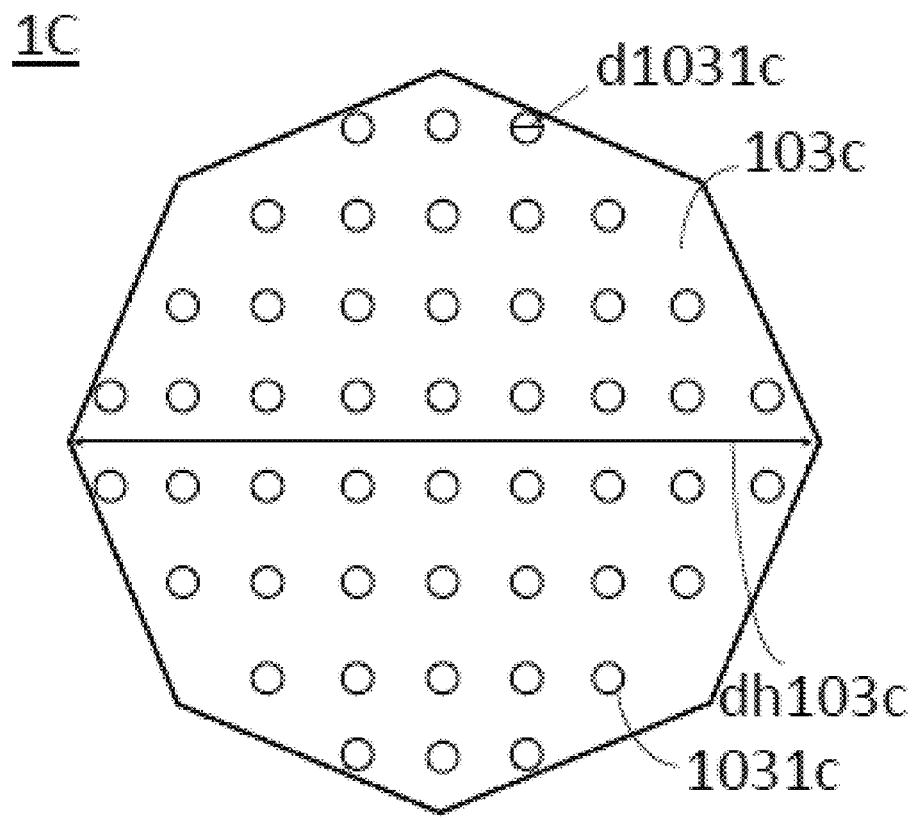
FIG. 3C is a bottom view of a shower head assembly according to one other embodiment of the present disclosure.

Refer to FIG. 1A and FIG. 3A-FIG. 3C, FIG. 3A is a bottom view of a shower head assembly according to one embodiment of the present disclosure, and each of FIG. 3B and FIG. 3C is a bottom view of a shower head assembly according to one other embodiment of the present disclosure. The column component of the shower head assembly 1, 1A, 1B, and 1C may be the cylindrical column component 103a as shown in FIG. 3A, or may also be the first prism component (for example, the hexagonal column component 103b shown in FIG. 3B, or the octagonal column component 103c as shown in FIG. 3C, but the present disclosure does not limit the number of sides of the prism component), wherein when the column component is a prism component and has more polygons, the flow field of the material which passes the shower head assembly is more similar to the phenomenon when the column component is a cylindrical column component.

Next, refer to FIG. 1A, FIG. 2A-FIG. 2C and FIG. 3A-FIG. 3C, the first bottom edge B101 of the first trapezoidal column component 101 has, for example, but not limited to, a first bottom dimension distance dh101 of 35-50 mm. When the first trapezoidal column component is the first trapezoidal cylindrical column component 101a, the first bottom dimension distance is the first bottom diameter distance dh101a, or when the first trapezoidal column component is the first trapezoidal prism component, the first bottom dimension distance is the first bottom diagonal distance dh101b. The second trapezoidal column component 102 has a second vertical distance dv102 which is a distance from the second top edge T102 to the second bottom edge B102, wherein the second vertical distance dv102 is, for example, but not limited to 7.5-10.5 mm. The column component 103 has a column vertical distance dv103 which is a distance from the top edge T103 to the column bottom part B103, and further has a column bottom dimension distance dh103, wherein the column vertical distance dv103 is, for example, but not limited to, 2-3 cm, and the column bottom dimension distance dh103 is, for example, but not limited to, 285-315 mm. In this way, the flow field of the fluid passing through the shower head assembly 1 can be more stable.

When the column component is a cylindrical column component 103a, the column bottom dimension distance is a column bottom diameter distance dh103a, or when the column component is a prism component, the column bottom dimension distance is column bottom diagonal distance dh103b. Furthermore, the widths of the openings of the nozzles 1031a, 1031b and 1031c associated with the column component 103 are marked as d1031a, d1031b, and d1031c, and the widths of the openings of the nozzles 1031a, 1031b and 1031c are for example, but not limited to, 0.4-1.5 mm. Please note that, the number and shape of nozzles are not used to limit the present disclosure.

Specifically, when the vertical section of the vertical runners is rectangular, the width of the opening of the nozzle is the same as the width at any place of the vertical runner, and is 0.4-1.5 mm. In other one embodiment, when the longitudinal section of the vertical runner is irregular, the width of the thinnest part of the vertical runner is 0.4-1.5 mm.

The specific specification of the shower head assembly 1, 1A, 1B, and 1C are restricted in that the ratio of the column vertical distance dv103 to the second vertical distance dv102 must be greater than or equal to 1.2, and furthermore, the total distance of the column vertical distance dv103 and the second vertical distance dv102 must always be less than the first bottom dimension distance dh101, so that the shower head assembly 1, 1A, 1B, 1C can receive the target (for example, but not limited to the substance or the reaction precursor to be deposited in the integrated circuit process), so that the target can be uniformly distributed in the shower head assembly 1, 1A, 1B, 1C, the final target can be sprayed out by the plurality of nozzles 1031a, 1031b, 1031c simultaneously. In the better case, when the ratio of the column vertical distance dv103 to the second vertical distance dv102 is 2-4, it can achieve better uniform spraying effect.

In one embodiment, the length of the vertical runner is the same as the column vertical distance DV103. In one embodiment, the ratio of the length of the vertical runners to the second vertical distance dv102 is greater than or equal to 1.2, and the widths d1031a, d1031b and d1031c of the openings of the nozzles are 0.4-1.5 mm. A better situation is that when the ratio of the length of the vertical runner to the second vertical distance dv102 is 2-4, a better uniform spraying effect can be achieved. Similarly, when the vertical section of the vertical runners is rectangular, the width of the opening of the nozzle is the same as the width of the vertical runner anywhere, and is 0.4-1.5 mm. In other one embodiment, when the longitudinal section of the vertical runner is irregular, the width of the thinnest part of the vertical runner is 0.4-1.5 mm.

In other one embodiment, the length of the vertical runner may also be different from the column vertical distance DV103. For example, when the nozzles penetrating the column component 103 are connected to each other near the top edge T103, the length of the vertical runner does not include the communicating part of the nozzles, and that is, the length of the vertical runner does not include the communicating part of the nozzles near the top edge T103.

Figure 4:
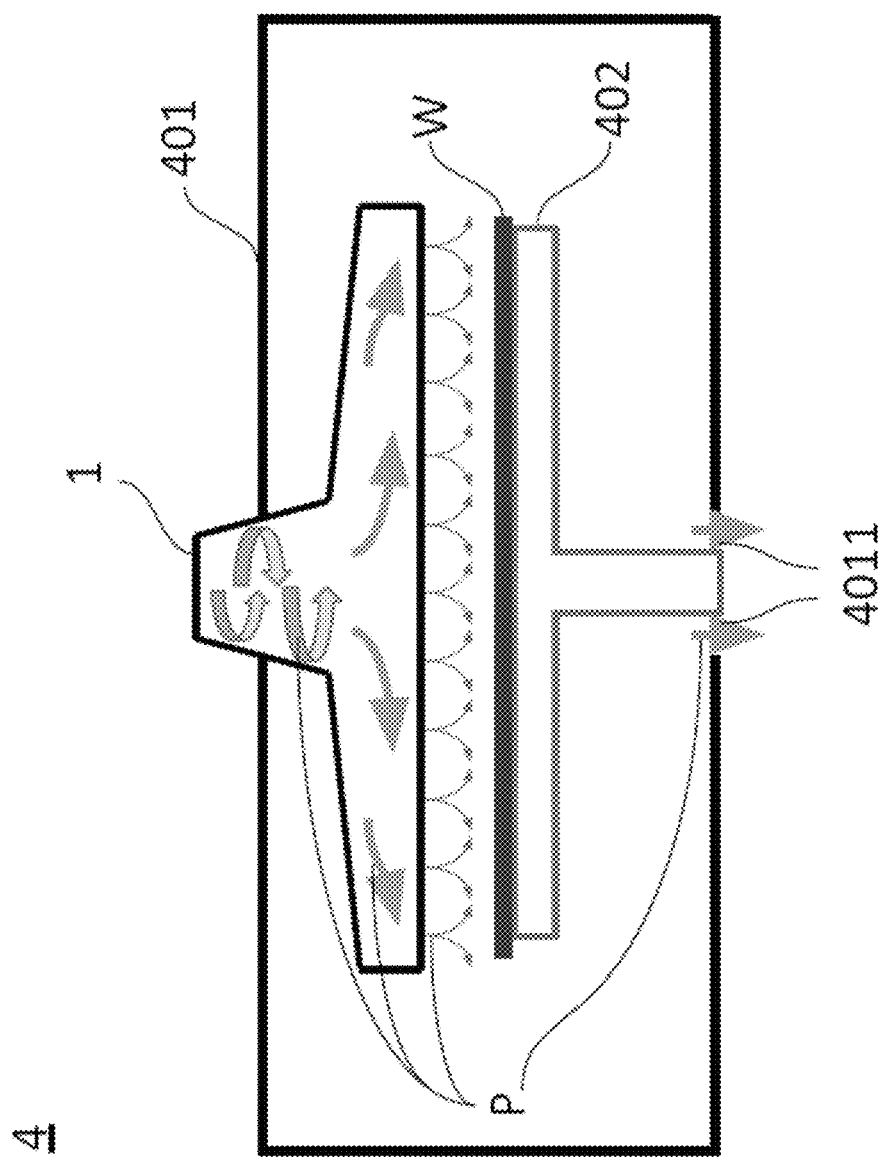
FIG. 4 is a schematic diagram of an ALD device according to one embodiment of the present disclosure.

Next, refer to FIG. 4, and FIG. 4 is a schematic diagram of an ALD device according to one embodiment of the present disclosure. The ALD device 4 includes a shower head assembly 1 (the shower head assembly can be any of the above embodiments), a reaction chamber 401 and a substrate carrier 402. The shower head assembly 1 is installed above the reaction chamber 401, and the substrate carrier 402 is installed inside the reaction chamber 401. During the ALD process, the shower head assembly 1 receives the reaction precursor P through the first top edge of the first trapezoidal column component. When the reaction precursor P passes through the shower head assembly 1 with the specific specification, it can be uniformly distributed, and then uniformly sprayed from the nozzles to the substrate W (such as, but not limited to, silicon wafer) carried by the substrate carrier 402, and the excess reaction precursor P is exhausted through the vent opening 4011 at the bottom of the reaction chamber 401.

Please refer to Table 1 for the effects of the shower head assembly 1 and the ALD device 4. Table 1 is a thickness table of a 12-inch silicon wafer after undergoing an ALD process. As shown in Table 1, a 12-inch silicon wafer is used. After the ALD process is performed on the wafer (process conditions: pulse time is 0.1 second; soak time is 0.5 second), the thickness uniformity of the wafer is 0.34686 and good results are achieved. Please note here that the shower head assembly described in the present disclosure is not limited to be used in the ALD process and its equipment, and it can also be used in any integrated circuit process and device that requires the shower head assembly.

TABLE 1

| Substrate: 12-inch silicon wafer Process Condition: Pulse time: 0.1 second Soak time: 0.5 second | |
| --- | --- |
| Center thickness of wafer | 19.80 nm |
| Right side thickness of wafer | 19.81 nm |
| Left side thickness of wafer | 19.97 nm |
| Bottom thickness of wafer | 19.89 nm |
| Top thickness of wafer | 19.88 nm |
| Average thickness of wafer | 19.87 nm |
| Thickness uniformity (U %) of wafer | 0.34686 |

Based on the above descriptions, compared with the prior art, the technical effects of the shower head assembly and the ALD device according to the embodiment of the present disclosure are described as follows.

In the prior art, the shower head assembly used for the ALD of the integrated circuit can only provide the reaction precursor to the substrate from the center of the nozzles, which often causes the problem of poor deposition uniformity, and the conventional solution needs to increases the amount of reaction precursor or prolonging the reaction time to overcome the problem. By contrast, in the shower head assembly and the ALD device using the shower head assembly of the present disclosure, the structure of the shower head assembly has a specific specification, the reaction precursor can be uniformly diffused in the shower head assembly in advance after receiving the reaction precursor, so that the reaction precursor can be sprayed uniformly through the nozzles to the substrate. Accordingly, a better uniformity deposition effect can be achieved without additional money or time cost.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A shower head assembly for an integrated circuit manufacturing process, comprising:
a first trapezoidal column component, having a first top edge, a first bottom edge and a first hollow part, wherein the first bottom edge has a first bottom dimension distance, the first bottom dimension distance is a first bottom diameter distance when the first trapezoidal column component is a first trapezoidal cylindrical column component, and the first bottom dimension distance is a first bottom diagonal distance when the first trapezoidal column component is a first trapezoidal prism component;

a second trapezoidal column component, having a second top edge, a second bottom edge and a second hollow part, wherein the second top edge and the second bottom edge have a second vertical distance therebetween, the second top edge is connected to the first bottom edge of the first trapezoidal column component, and the second hollow part is communicated with the first hollow part;

a column component, having a top edge, a column bottom part and multiple nozzles, wherein a top edge and the column bottom part has a column vertical distance therebetween, the column vertical distance is 2-3 cm, the top edge is connected to the second bottom edge of the second trapezoidal column component, the nozzles are communicated with the second hollow part, the nozzles are vertical runners in the column component, and openings of the nozzles are disposed on the column bottom part;

wherein a total distance of the second vertical distance and the column vertical distance is less than the first bottom dimension distance.

2. The shower head assembly of claim 1, wherein a ratio of the column vertical distance to the second vertical distance is larger than or equal to 1.2.

3. The shower head assembly of claim 2, wherein a thinnest part of the vertical runner of the column component has a width of 0.4-1.5 mm.

4. The shower head assembly of claim 1, wherein the ratio of the column vertical distance to the second vertical distance is 2-4.

5. The shower head assembly of claim 4, wherein a thinnest part of the vertical runner of the column component has a width of 0.4-1.5 mm.

6. The shower head assembly of claim 1, wherein a thinnest part of the vertical runner of the column component has a width of 0.4-1.5 mm.

7. The shower head assembly of claim 1, wherein the first trapezoidal column component, the second trapezoidal column component and the column component are integrally formed or combined with each other to form the shower head assembly.

8. A shower head assembly for an integrated circuit manufacturing process, comprising:
a first trapezoidal column component, having a first top edge, a first bottom edge and a first hollow part, wherein the first hollow part penetrates the first top edge and the first bottom edge;
a second trapezoidal column component, having a second top edge, a second bottom edge and a second hollow part, wherein the second hollow part penetrates the second top edge and the second bottom edge, the second top edge and the second bottom edge have a second vertical distance therebetween, the second top edge is connected to the first bottom edge of the first trapezoidal column component, and the second hollow part is communicated with the first hollow part; and
a column component, having a top edge, a column bottom part and multiple nozzles, wherein the nozzles penetrate the top edge and the column bottom part, the top edge and the column bottom part has a column vertical distance therebetween, the column vertical distance is 2-3 cm, the top edge is connected to the second bottom edge of the second trapezoidal column component, the nozzles are communicated with the second hollow part, the nozzles are vertical runners in the column component, and openings of the nozzles are disposed on the column bottom part;

wherein a ratio of a length of the vertical runner to the second vertical distance is larger than or equal to 1.2.

9. The shower head assembly of claim 8, wherein a thinnest part of the vertical runner of the column component has a width of 0.4-1.5 mm.

10. The shower head assembly of claim 8, wherein the ratio of the length of the vertical runner to the second vertical distance is 2-4.

11. The shower head assembly of claim 10, wherein a thinnest part of the vertical runner of the column component has a width of 0.4-1.5 mm.

12. The shower head assembly of claim 8, wherein the first bottom edge of the first trapezoidal column component further has a first bottom dimension distance, the first bottom dimension distance is a first bottom diameter distance when the first trapezoidal column component is a first trapezoidal cylindrical column component, and the first bottom dimension distance is a first bottom diagonal distance when the first trapezoidal column component is a first trapezoidal prism component; wherein a total distance of the second vertical distance and the column vertical distance is less than the first bottom dimension distance.

13. The shower head assembly of claim 12, wherein a thinnest part of the vertical runner of the column component has a width of 0.4-1.5 mm.

14. The shower head assembly of claim 8, wherein a ratio of the column vertical distance to the second vertical distance is 2-4.

15. The shower head assembly of claim 14, wherein the ratio of the length of the vertical runner to the second vertical distance is 2-4.

16. The shower head assembly of claim 14, wherein a thinnest part of the vertical runner of the column component has a width of 0.4-1.5 mm.

17. The shower head assembly of claim 16, wherein the first trapezoidal column component, the second trapezoidal column component and the column component are integrally formed or combined with each other to form the shower head assembly.

18. The shower head assembly of claim 8, wherein the first trapezoidal column component, the second trapezoidal column component and the column component are integrally formed or combined with each other to form the shower head assembly.

19. An atomic layer deposition (ALD) device, comprising:
the shower head assembly of claim 1;
a reaction chamber, having a vent opening, wherein the shower head assembly is disposed on the reaction chamber; and
a substrate carrier, disposed in the reaction chamber;
wherein the shower head assembly sprays reaction precursor to a substrate carried on the substrate carrier, and the vent opening exhausts excess reaction precursor from the reaction chamber.

20. The ALD device of claim 19, wherein the substrate carried on the substrate carrier is a silicon wafer.

* * * * *